US005751818A

United States Patent [19]

Gertz et al.

[11] Patent Number: 5,751,818

[45] Date of Patent: May 12, 1998

[54] CIRCUIT SYSTEM FOR SWITCHING LOUDSPEAKERS

[75] Inventors: Jonathan Gertz, Lexington; Mark S. Butcher, Paris; James M. Tuomy, Lexington, all of Ky.

[73] Assignee: Audio Authority Corporation, Lexington, Ky.

[21] Appl. No.: 708,515

[22] Filed: Sep. 5, 1996

Related U.S. Application Data

[63] Continuation-in-part of Ser. No. 583,328, Jan. 5, 1996, abandoned.

[51] Int. Cl.$^6$ .............................. H03G 3/20; H04R 27/00

[52] U.S. Cl. .............................. 381/55; 381/81; 381/85; 381/123

[58] Field of Search .............................. 381/55, 78, 81, 381/82, 85, 123

[56] References Cited

U.S. PATENT DOCUMENTS

| | | | |
|---|---|---|---|
| 2,237,448 | 4/1941 | Reinhard | 381/55 |
| 2,830,117 | 4/1958 | Blow | 381/82 |
| 3,662,107 | 5/1972 | Vorgan . | |
| 3,890,465 | 6/1975 | Kaizu | 381/55 |
| 3,925,708 | 12/1975 | Picciochi | 381/55 |
| 3,959,736 | 5/1976 | Grosjean | 381/55 |
| 4,004,095 | 1/1977 | Cardone . | |
| 4,122,507 | 10/1978 | Queen . | |
| 4,163,119 | 7/1979 | Baba et al. | 381/55 |
| 4,296,278 | 10/1981 | Cullison et al. | 381/55 |
| 4,301,330 | 11/1981 | Trump | 381/55 |
| 4,330,686 | 5/1982 | Roe | 381/55 |
| 4,468,806 | 8/1984 | Gaulden et al. | 381/123 |
| 4,490,770 | 12/1984 | Phillimore | 361/94 |
| 4,864,624 | 9/1989 | Tichy | 381/55 |
| 4,944,015 | 7/1990 | Juve et al. | 381/55 |
| 4,953,218 | 8/1990 | Hughes, Jr. | 381/55 |
| 5,131,048 | 7/1992 | Farenelli et al. | 381/85 |
| 5,165,097 | 11/1992 | Morishima et al. | 381/85 |
| 5,343,534 | 8/1994 | Dorrough et al. | 381/123 |
| 5,479,516 | 12/1995 | Damato et al. | 381/82 |
| 5,526,434 | 6/1996 | Wakui | 381/55 |
| 5,528,695 | 6/1996 | Klippel | 381/55 |
| 5,577,126 | 11/1996 | Klippel | 381/55 |

*Primary Examiner*—Curtis A. Kuntz
*Assistant Examiner*—Xu Mei
*Attorney, Agent, or Firm*—King and Schickli

[57] ABSTRACT

A circuit system for selectively switching between main and remote loudspeakers includes a pair of input terminals for applying an input audio signal to the loudspeakers. A first selector switch contact is provided in series with the main loudspeakers. A second selector switch contact is provided in series with the remote loudspeakers. A current-dependent resistance element is provided in series with the remote loudspeakers to protect the remote loudspeakers from overdrive. The circuit system may also include a second current-dependent resistance element and a cooperating defeat switch contact as well as a resistor and associated load limiting switch contact all in series with the remote loudspeakers.

13 Claims, 2 Drawing Sheets

CIRCUIT SYSTEM FOR SWITCHING LOUDSPEAKERS

This is a continuation-in-part of U.S. patent application Ser. No. 08/583,328, filed Jan. 5, 1996, entitled "Circuit System for Switching Loudspeakers", now abandoned.

TECHNICAL FIELD

The present invention relates generally to the audio component field and, more particularly, to a circuit system for the selective switching of main and remote loudspeakers.

SUMMARY OF THE INVENTION

Typical home audio systems include a primary or main set of loudspeakers and one or more pairs of auxiliary or remote loudspeakers. The main loudspeakers are usually located in the same area as and are wired directly to the amplification system. The remote loudspeakers are usually located in other rooms throughout the home or, possibly, on an outdoor patio or in a garden area. The remote loudspeakers are usually smaller and are designed for less conspicuous installation than the main loudspeakers. Accordingly, in-wall, miniature and outdoor loudspeakers are popular for remote use. Such loudspeakers are usually less expensive and they are also somewhat compromised in power handling and frequency response when compared to the main loudspeakers. Thus, it should be appreciated that it is generally understood that the main loudspeakers are more appropriate for more "serious" or critical listening while the remote loudspeakers are adequate for providing high quality background music to additional locations.

For the consumer desiring to power additional remote loudspeakers from a single stereo amplifier or receiver, a number of shortcomings soon become apparent. First and foremost, most consumer amplifiers do not provide connections and controls for more than two sets of loudspeakers: that is, the main loudspeakers and one set or pair of remote loudspeakers. In contrast, most consumers desiring remote loudspeakers want remote loudspeakers in several different rooms and also want the ability to run any one or all of them simultaneously.

It should also be appreciated that the driving of multiple sets of loudspeakers with a single amplifier typically results in volume imbalances at least between the main and remote loudspeakers. This is due to a number of factors. These include the fact that the main loudspeakers typically have a wider frequency range and more accurate frequency response but are less efficient than remote loudspeakers: that is, they do not play as loud given the same electrical input. Further, there are other contributing factors that compound the discrepancy in efficiency and, hence, the resulting sound volume differential. These include the fact that the listening room for the main loudspeakers is typically larger than the room where the more efficient remote loudspeakers are installed. Hence, greater volume levels are required from the main loudspeakers in order to fill the larger room with an equivalent level of sound.

Further, as noted above, the remote loudspeakers are generally utilized to provide high quality background music and background listening levels are significantly lower than the "live" levels often desired for critical listening from the main loudspeakers. As a result of these factors, in a typical situation where the volume level for the remote loudspeakers is set for pleasant background listening, the sound performance level from the main loudspeakers is completely inadequate. Conversely, if the volume setting is adjusted for the desired "live" listening levels from the main loudspeakers, then the sound pressure level from the remote loudspeakers is undesirably high, possibly even deafening, and the remote loudspeakers have the potential to become overloaded and damaged.

One way to drive multiple sets of remote loudspeakers from a single amplifier is to connect the multiple remote loudspeakers to the amplifier in a parallel circuit. While this may at first appear to be a feasible solution to the problem, it must be noted that the impedance presented to the amplifier is substantially lowered as a result of the nature of this wiring arrangement. In fact, impedance may become so low that amplifier distortion becomes a significant problem resulting in protective shut down of the amplifier or possibly even damage to the amplifier.

In order to address this problem, some manufacturers have recently been offering speaker switching systems that may be attached as an accessory to an amplifier or receiver. Such systems typically allow the connection of four or more sets of loudspeakers to the amplifier or receiver while providing selective control of each set. Examples of such state of the art speaker switching systems are provided in, for example, U.S. Pat. No. 3,662,107 to Vorgan and 4,468,896 to Gaulden et al.

One problem with such state of the art speaker switching systems is that they do not distinguish between the main and remote loudspeakers. All loudspeakers are simply wired in parallel to the amplifier and, accordingly, all loudspeakers simply receive approximately the same amount of power, in accordance to their impedance. This results in the sound differential problem already noted. Thus, an individual must compromise between the desired sound level of the main and remote loudspeakers and is, therefore, often prevented from achieving the desired result.

It should also be appreciated that most commercially available speaker switching systems offer only marginal protection for the amplifier. This is done by incorporating internal series limiting resistors that are manually activated by a push button switch. When the operator presses the switch, the limiting resistor is inserted in series with the other selected loudspeakers thereby theoretically raising the total load on the amplifier to a safe range above 4 ohms. This control scheme, of course, requires that a positive action (the pressing and/or activating of the push button switch) be taken by the operator and assumes the operator knows or will learn when to engage the "protection" button. Generally, this is not a realistic expectation since most operators are completely unfamiliar with electrical equipment theory and operation. Further, since the initial effect of activating the protection push button switch is a reduction in sound pressure levels, many individual operators will have a tendency to promptly de-activate "protection" to restore the higher volume levels.

It should also be noted that the ultimate power handling capability of the state of the art devices is generally determined by the rating of the internal resistors and the ability of those resistors to dissipate amplifier power by conversion of that power to heat instead of sound. This significantly limits the amplifier power range with which any particular switching system is compatible. Additionally, the systems also offer no effective overdrive or damage protection for the more efficient remote loudspeakers.

After fully considering the above, it is clear that a need is identified for an improved circuit system for switching loudspeakers. An ideal circuit system would allow simultaneous connection and activation of multiple pairs of loudspeakers while distinguishing between the uses typical of main loudspeakers (live listening) and remote loudspeakers (background music). An ideal system would also provide controls for an adequate number of remote loudspeakers while protecting those remote loudspeakers from accidental damage due to excessively high power input levels. Further, such a system would automatically protect the amplifier from unsafe electrical loads such as typically occur when simultaneously driving several loudspeakers wired in parallel. Further, an ideal system would do all of the above without adversely impacting the sonic qualities of the associated amplifier and loudspeakers.

SUMMARY OF THE INVENTION

Accordingly, it is a primary object of the present invention to provide a circuit system for selectively switching loudspeakers overcoming the above-described limitations and disadvantages of the prior art and providing the above described features of an "ideal system".

Still another object of the present invention is to provide a circuit system for selectively switching between loudspeakers that automatically protects the amplifier and loudspeakers from damage and provides a visual indication of the functioning of the protection system.

Yet another object of the present invention is to provide a relatively simple and inexpensive circuit system for selectively switching between loudspeakers that provides separate and parallel pathways for the main loudspeakers and the remote loudspeakers while incorporating average-current-dependent resistance elements in the remote speaker pathway to protect the remote loudspeakers and amplifier respectively from overdrive damage and overload damage.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purposes of the present invention as described herein, a circuit system for selectively switching between main and remote loudspeakers is provided. Preferably, the circuit system includes a pair of input terminals for applying an input audio signal to the selected main and remote loudspeakers. A first switch contact is provided in series with the main loudspeakers. This first switch contact allows one to selectively apply the input audio signal to the main loudspeakers. The circuit system also includes a second switch contact in series with the remote loudspeakers. This second switch contact allows one to selectively apply the input audio signal to the remote loudspeakers. Additionally, a first current-dependent resistance element is provided in series with the remote loudspeakers for automatically compensating for changes in the audio signal level and thereby protecting the remote loudspeakers from overdrive.

Still further describing the invention, the circuit system may include a third switch contact in parallel with a first of the remote loudspeakers for selectively applying the input audio signal to the first of the remote loudspeaker. A fourth switch contact may also be provided in parallel with a second remote loudspeaker to allow one to selectively apply the input audio signal to the second of the remote loudspeakers.

In accordance with yet another aspect of the present invention, the circuit system may include a means for limiting the load on a receiver or amplifier producing the input audio signal. Preferably, the load limiting means includes a resistor in series with the first and second remote loudspeakers and a load limiting switch contact in parallel with the resistor. Thus, opening and closing the switch contact allows one to switch the load resistor into and out of the circuit.

Still further, the circuit system may include a second current-dependent resistance element in series with the remote loudspeakers and a defeat switch contact in parallel with the second current-dependent resistance element. Preferably, the first and second current-dependent resistance elements are incandescent lamps. In this way, it is possible to increase the load impedance to the amplifier or receiver. More specifically, as more current passes through the lamps with any increase in amplifier output (i.e. volume) the lamp filaments undergo greater heating thereby increasing their resistance. This result is due to the logarithmic positive temperature coefficient of the lamps. Advantageously, it should be appreciated that the resulting receiver/amplifier protection is provided without introducing undesired audible artifacts such as distortion into the audio signal because of the long thermal time constant of the lamps. Further, the lamps advantageously provide a visual indication that allows one to confirm that the remote loudspeaker protection circuit is functioning.

The provision of the second resistance element in series with the first allows the circuit system to be tuned to the performance characteristics of the receiver or amplifier. More specifically, the defeat switch contact in parallel with the second lamp is maintained open to provide the second lamp in series connection in order to provide the proper and desired performance characteristics when used with relatively high wattage receivers/amplifiers. Alternatively, for relatively low wattage receivers/amplifiers, the defeat switch contact is closed thereby removing the second lamp from the circuit and eliminating this drain on the smaller amplifier's more limited power. In this way, the circuit system is again tuned to provide the desired performance characteristics.

Still other objects of the present invention will become apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawing incorporated in and forming a part of the specification, illustrates several aspects of the present invention and together with the description serves to explain the principles of the invention. In the drawing.

Reference will now be made in detail to the present preferred embodiment of the invention, an example of which is illustrated in the accompanying drawing.

DETAILED DESCRIPTION OF THE INVENTION

Figure 1:
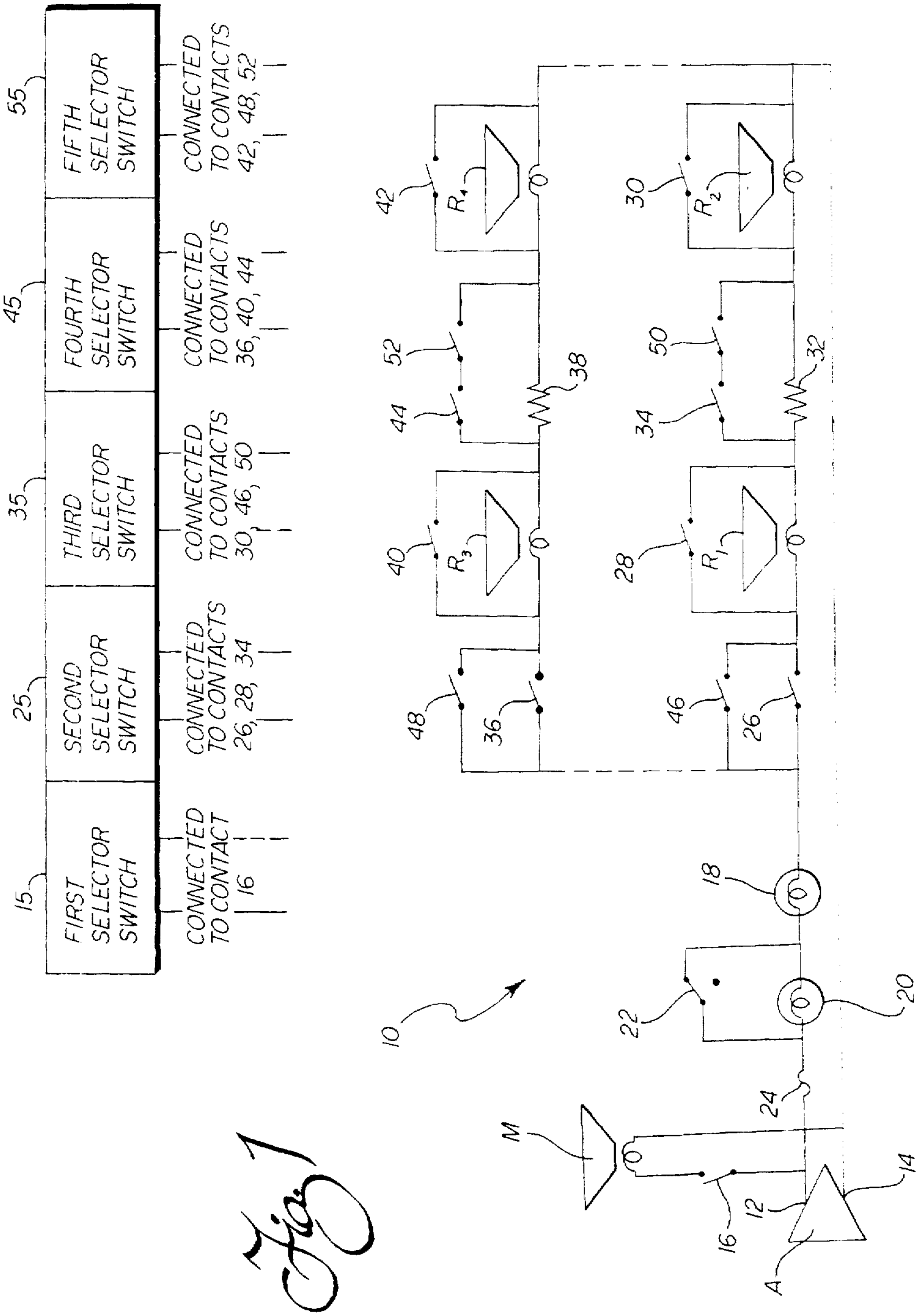
FIG. 1 is a schematical block diagram demonstrating the circuit system of the present invention for selectively switching between main and remote loudspeakers.

Reference is now made to FIG. 1 generally showing the circuit system 10 of the present invention for selectively switching between main and remote loudspeakers M, R (e.g. $R_1$, $R_2$) respectively. As shown the circuit system 10 includes input terminals 12, 14 that are operatively connected to an audio power amplifier A which represents the output stage of a stereo home music system. For clarity of presentation, only one channel of the stereo system is shown. It should be appreciated, however, that two identical channels are used in practice.

As should be appreciated from viewing FIG. 1, both the main and remote loudspeakers M, $R_1$–$R_4$ are wired across the input terminals 12, 14 in order to receive the audio signal from the amplifier A. The main loudspeaker M is, however, wired in parallel relative to the remote loudspeaker groups $R_1$, $R_2$ and $R_3$, $R_4$ while the remote loudspeakers within each group are provided in series with respect to one another. A first selector switch 15 (e.g. a multi-pole double throw switch such as a model no. 65017206 as manufactured by Switchcraft, Inc. of Chicago, Ill.) is provided to control the switch contact 16 that is provided in series with the main loudspeakers. When the switch contact 16 is open, the main loudspeakers M are switched off or deactivated. In contrast, when the switch contact 16 is closed, the main loudspeakers M are switched on or activated to receive the input audio signal from the amplifier A.

A first current-dependent resistance element 18, preferably in the form of an incandescent lamp (e.g. a 12.8 volt, 2.1 amp lamp such as model no. SK3-CWT lamp available from Osrom Sylvania, Inc. of Hillsboro, N.H.), is provided in series with the remote loudspeakers $R_1$–$R_4$. As will become more apparent as the description hereof proceeds, the first non-linear resistance element 18 functions to automatically compensate for changes in the input audio signal level thereby protecting the remote loudspeaker $R_1$–$R_4$ from overdrive. A second current-dependent resistance element 20 (e.g. a similar incandescent lamp) may also be provided in series with the remote loudspeakers $R_1$–$R_4$ and the first current-dependent resistance element 18. A defeat switch contact 22 may be provided in parallel with the second current-dependent resistance element 20. The provision of the two current-dependent resistance elements 18, 20 allows one to initially set the operating parameters of the circuit system 10 to match the output of the power amplifier A in order to provide proper amplifier and remote loudspeaker protection.

Thus, for example, for relatively high powered amplifiers of up to 300 watts, the defeat switch contact 22 is open so that both the first and second current-dependent resistance elements 18, 20 function in series in the signal line between the amplifier A and the remote loudspeakers $R_1$–$R_4$. More specifically, the added resistance effect of the two current-dependent resistance elements 18, 20 provides the desired remote loudspeaker protection. In contrast, for a relatively low powered power amplifier of, for example, less than 100 watts, the defeat switch contact 22 is closed thereby removing the second current-dependent resistance element 20 from the signal line between the amplifier and the remote loudspeakers $R_1$, $R_2$. The first current-dependent resistance element 18, however, remains in series with the remote loudspeakers $R_1$, $R_2$ to provide the desired overdrive protection. Of course, a fuse 24 (such as a model no. RXE135 fuse manufactured by Raychem Corporation of Menlo Park, Calif. and rated at 1.35A) may also be provided in series between the amplifier A and the remote loudspeakers $R_1$, $R_2$. The fuse 24 interrupts current flow in the event of catastrophic failure of the amplifier or a short circuit in the wiring.

As further shown in FIG. 1, a switch contact 26 of a second selector switch 25 and a switch contact 46 of a third selector switch 35 is provided in series with the remote loudspeakers $R_1$, $R_2$. Either of the switch contacts 26, 46 (e.g. of a multi-pole switch like switch 16) is closed to transmit the input audio signal from the amplifier to the remote loudspeakers $R_1$, $R_2$; both switch contacts 26, 46 are opened to turn off or deactivate the remote loudspeakers. Additionally, switch contacts 28, 30 may be provided. The switch contact 28 is wired in parallel to the first remote loudspeaker $R_1$ and the switch contact 30 is wired in parallel to the second remote loudspeaker $R_2$. When the switch contact 26 is closed and switch contact 28 is open, the first remote loudspeaker $R_1$ is turned on or activated. When the switch contact 46 is closed and switch contact 30 is open, the second remote loudspeaker $R_2$ is activated. When either the switch contact 26 or the switch contact 46 is closed and both the switch contact 28 and the switch contact 30 are open, both remote loudspeakers $R_1$, $R_2$ are turned on or activated and receive the input audio signal.

In accordance with still another aspect of the present invention, a dummy load resistor 32 (such as a model no. RH-25 resistor manufactured by Dale Electronics, Inc. of Columbus, Neb., rated at 6 ohms) may be provided in series with the remote loudspeakers $R_1$, $R_2$. Further, series-wired dummy load switch contacts 34, 50 may be provided in parallel to the resistor 32. When both of the remote loudspeakers $R_1$, $R_2$ are switched on or activated by the closing of the contacts 26, 46 and the opening of the contacts 28, 30, the dummy load switch contacts 34, 50 are closed so that the resistor 32 is bypassed or inactive. When the remote loudspeaker $R_1$ is switched off while the remote loudspeaker $R_2$ remains on, that is, when contact 28 is closed while contact 30 remains open, dummy load switch contact 34 is also opened and resistor 32 is provided in the circuit as a substitute for the deactivated remote loudspeaker $R_2$. Similarly, when remote loudspeaker $R_2$ is switched off by closing contact 30 while remote loudspeaker $R_1$ remains on, dummy load switch contact 50 is opened and resistor 32 is provided in the circuit. In this way, either remote loudspeaker $R_1$ or $R_2$ may be deactivated without introducing an unexpected volume change in the remaining remote loudspeaker or altering the effect of the current dependent resistor on the remaining speaker.

As further shown in FIG. 1, third and fourth remote loudspeakers $R_3$, $R_4$ may be operatively connected in the circuit system 10. The third and fourth remote loudspeakers $R_3$, $R_4$ are connected in series relative to one another and in parallel with respect to the first and second remote loudspeakers $R_1$, $R_2$. Similarly, fourth and fifth selector switches 45 and 55 are respectively provided for controlling switch contacts 36, 48 in series with the remote loudspeakers $R_3$, $R_4$ and the dummy load resistor 38. Additional switch contacts 40, 42 are provided in parallel with respective remote loudspeakers $R_3$, $R_4$ with dummy load switch contacts 44, 52 provided in parallel with dummy load resistor 38.

When closed, either switch contact 36, 48 provides an input audio signal to the branch of the circuit system leading to the remote loudspeakers $R_3$, $R_4$. When switch contacts 36 and 48 are closed and switch contacts 40, 42 are open, remote loudspeakers $R_3$, $R_4$ are both activated to receive the input audio signal. At the same time, load limiting switches 44, 52 are also closed to defeat the dummy load resistor 38.

Of course, the switch contacts 40, 42 may be closed in order to turn off or deactivate respective remote loudspeakers $R_3$, $R_4$. Simultaneously, either dummy load switch contact 44 or 52 is opened to provide the dummy load resistor 38 in the circuit when one of the remote loudspeakers $R_3$, $R_4$ is deactivated as desired in order to maintain a consistent sound level.

As should be appreciated, the wiring architecture of the circuit system 10 of the present invention provides a number of very unique advantages heretofore unavailable with speaker selection circuits and systems of the prior art. For example, the present circuit system 10 recognizes the fact that main loudspeakers M and remote loudspeakers $R_1$–$R_4$ are typically of different classes and are used very differently. The main loudspeakers are stationed in the main listening area and are for serious or critical listening usually at higher sound levels. In contrast, the remote loudspeakers are generally in remote rooms spread throughout the home and are usually driven for purposes of providing relatively high quality background music. While the main loudspeakers have a wider frequency range and more accurate frequency response they are less efficient than the remote loudspeakers and hence the main loudspeakers do not play as loud given the same electrical input.

The present system recognizes these classifications and user differences and effectively provides a direct drive circuit to the main loudspeakers M while providing overdrive protection to the more efficient remote loudspeakers $R_1$–$R_4$. This is accomplished by means of the first current-dependent resistance element 18 in low wattage amplifier systems and the first and second current-dependent resistance elements 18, 20 in relatively high wattage amplifier systems. Advantageously, when incandescent lamps are utilized as the current-dependent resistance elements 18, 20, fluctuations in amplifier load are automatically compensated for without producing audible artifacts. Specifically, when the amplifier output increases, the temperature of the lamps also increases and their resistance rises. Thus, assuming a constant music level, as the parallel wired remote loudspeakers $R_1$–$R_4$ are switched in by the closing of, for example, the switch contacts 26, 36, 46, 48 and the audio signal current rises, the reduction in net loudspeaker impedance tends to be offset by the rising resistance of the lamps. While the rising resistance of the lamps minimally attenuates the sound pressure delivered by the remote loudspeakers $R_1$–$R_4$, the filaments exhibit pure resistance at audio frequencies and have a very long thermal time constant. Thus, the lamps produce no other audible effects.

Advantageously, the alternating parallel/series architecture for the pairs of remote loudspeakers ($R_1$, $R_2$ and $R_3$, $R_4$) offers a solution to load management since it allows one to maintain a safe operating load for the amplifier while also reducing system operating inefficiencies. For example, if only one set of two loudspeakers pairs such as remote loudspeakers $R_1$, $R_2$ is activated then both dummy load resistors 32 and 38 are deactivated. Advantageously, amplifier load stability is preserved under substantially any combination of remote loudspeaker connection without the unnecessary power loss of a fixed dropping resistor. This not only protects the amplifier from overload but also eliminates undesired changes in volume as remote loudspeakers are selected in and out of the circuit system.

The benefits of a series-parallel remote loudspeaker network notwithstanding, occasionally it may be more desirable to connect the remote loudspeakers in a parallel network. One such occasion would be when autotransformer, or autoformer, type volume controls are used at one or more remote loudspeaker locations. Remote volume controls may be specified when volume of the remote loudspeakers at various room locations must be controlled independently from one another or from the main loudspeakers. Autoformer volume controls offer high electrical power efficiency but present a load impedance to the amplifier or switching system that varies with the volume setting of the autoformer control. Consequently, changing the value setting of an autoformer control may directly affect the volume of another remote loudspeaker connected in series with it.

Figure 2:
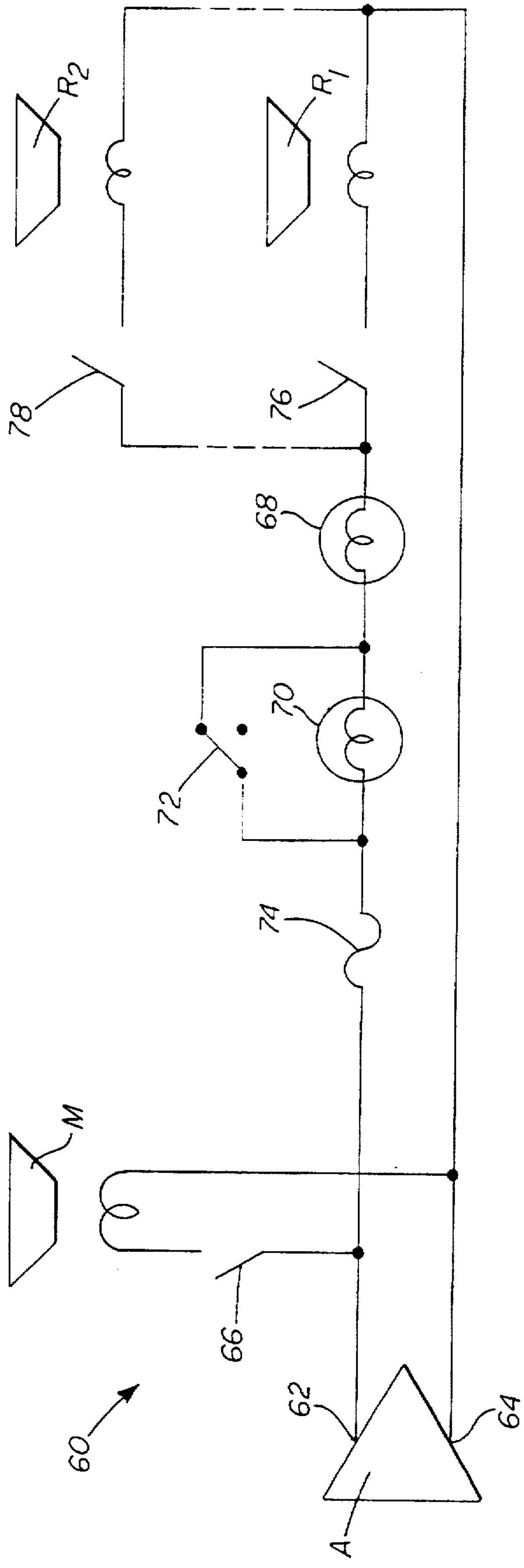
FIG. 2 is a schematical block diagram showing an alternative embodiment of the present invention.

The parallel remote loudspeaker circuit of FIG. 2 shows main loudspeakers M and remote loudspeakers R1 and R2 selectively connected to audio power amplifier A. One channel is shown for simplicity. Both the main and remote speakers are connected across the input terminals 62, 64 in order to receive the amplifier output. A first switch contact 66 wired in series with the main loudspeakers selectively turns the main loudspeakers on or off independently of any manual or automatic action pertaining to the remote loudspeakers R1 and R2.

First and second current-dependent variable resistance elements 68 and 70, respectively, are connected in series with the remote loudspeakers R1, R2. The first variable resistance element, which is permanently connected, functions to automatically limit current flow to the remote loudspeakers. The second variable resistance element is provided in series with the first variable resistance element when defeat switch 72 is open, for the purpose of adapting the switching system for more powerful amplifiers, in the range, for example, of 100 to 300 watts. An automatic resetting fuse 74 may be provided to protect the switching system and amplifier from catastrophic circuit faults.

A second switch contact 76 is shown connected in series with first remote loudspeaker R1. When switch contact 76 is open, remote loudspeaker R1 is off, and when switch contact 76 is closed, remote loudspeaker R1 is on. A third switch contact 78 turns second remote loudspeaker R2 on and off as desired. Because all remote loudspeakers are connected in parallel, switching one of them on or off has little effect on the volume levels of the others. Similarly, if a volume control with variable input impedance is connected between the switching system output and a remote loudspeaker input, its control position minimally affects the volume of remote loudspeakers other than the one it is associated with. Dummy load resistors employed in the previously described series-parallel remote loudspeaker switching system shown in FIG. 1 are not required in this straight parallel remote loudspeaker switching system.

As was the case with the series-parallel remote loudspeaker network described previously, the resistance of the variable resistance elements increase as the number of remote loudspeakers selected increases, tending to correct the falling load impedance seen by the amplifier as more remote loudspeakers are selected.

In summary, numerous benefits result from employing the concepts of the present invention. The careful selection of incandescent lamps for the current-dependent resistance elements 18, 20 and dummy load resistors 32, 38 provides a continuously variable compression slope with characteristics in both amplitude response and attack/delay timing that closely approximates the attack characteristics of the best dynamic range processors. This allows the remote loudspeakers $R_1$–$R_4$ to be played at moderate volume levels with no compression or limiting. However, at increasingly high power settings, the effects of compression/ limiting become more pronounced, the volume increase is therefore less in the remote loudspeakers than would be suggested by the volume control movement. Thus, the remote loudspeakers, which may be out of the hearing range of the operator at the time of volume adjustment are protected against inadvertent overdrive.

Advantageously, the provision of the second current-dependent resistance element 20 in conjunction with the parallel defeat switch contact 22 serves to allow the circuit system 10 to be tailored to provide proper operation with a wider range of amplifier output power than is possible with a single lamp arrangement. Additionally, the fuse 24 provides an added protection factor for interrupting current flow in the event of catastrophic failure of the amplifier or short circuit in the wiring.

As should also be noted, amplifier power is better proportioned between the main loudspeakers M and the remote loudspeakers $R_1$–$R_4$ by the relative parallel wiring arrangement wherein the main loudspeakers are directly wired to the amplifier while all circuitry to protect the amplifier from unsafe loads and protect the remote loudspeakers from overdrive has no effect on the main loudspeakers. Hence, the main loudspeakers may be driven for optimum performance in the primary listening area while the remote loudspeakers are protected and driven at more moderate volume levels than would otherwise be possible.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, it should be appreciated that the series/parallel network of remote speakers shown in FIG. 1 need not be limited to four and the parallel network of remote loudspeakers shown in FIG. 2 need not be limited to two as illustrated.

Further, it should be appreciated that the current dependent variable resistance elements 18, 20 or 68, 70 may also be formed from high positive temperature coefficient resistance wire (such as Kanthal 70, manufactured by Kanthal Corporation, Bethel Conn.). For example, 30 inches of 27 AWG Kanthal 70, a nickel alloy, yields a resistor of about 1.5 ohms at 25° C. with a temperature coefficient of resistance of about 0.4% per ° C. The gauge and length of nickel alloy resistance wire can be chosen to obtain a resistor of approximately the resistance and thermal time constant characteristics exhibited by a tungsten incandescent lamp operating over a larger temperature range. Therefore, the nickel alloy variable resistance element may be preferred over an incandescent lamp if excessive incandescence is to be avoided or if a lamp with a suitable combination of design voltage and current cannot be readily obtained.

The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

We claim:

1. A circuit system for selectively switching between main and remote loudspeakers, powered by an amplifier comprising:

- a pair of input terminals for applying an input audio signal to said main and remote loudspeakers;
- a first switch contact in series with said main loudspeakers for selectively applying said input audio signal to said main loudspeakers;
- a second switch contact in series with said remote loudspeakers for selectively applying said input audio signal to said remote loudspeakers; and
- a first current-dependent resistance element between said amplifier and said remote loudspeakers in series only with said remote loudspeakers for automatically compensating for changes in input audio signal load and protecting said remote loudspeakers from overdrive.

2. The system of claim 1, further including a second current-dependent resistance element in series with said remote loudspeakers and a defeat switch contact in parallel with said second current-dependent resistance element.

3. The system of claim 2, wherein at least one of said first and second current-dependent resistance elements is an incandescent lamp.

4. The system of claim 2, wherein at least one of said first and second current-dependent resistance elements is a high positive temperature coefficient resistance wire.

5. The system of claim 1, further including first and second remote loudspeakers and third and fourth switch contacts in parallel with said first and second remote loudspeakers for selectively applying said input audio signal to said first and second remote loudspeakers.

6. The system of claim 5, further including a fifth switch contact in series with third and fourth remote loudspeakers;

- a sixth switch contact in parallel with said third remote loudspeaker;
- a seventh switch contact in parallel with said fourth remote loudspeaker; and
- a second load maintaining means including a resistor in series with said third and fourth remote loudspeakers and a load dummy switch contact in parallel with said resistor;
- said fifth switch contact and third and fourth remote loudspeakers being in parallel with respect to said first switch contact and said first and second remote loudspeakers.

7. The system of claim 5, further including a second current-dependent resistance element in series with said remote loudspeakers and a defeat switch contact in parallel with said second current-dependent resistance element.

8. The system of claim 7, wherein said first and second current-dependent resistance elements are incandescent lamps.

9. The system of claim 5, further including a means for maintaining load, said load maintaining means including a resistor in series with said first and second remote loudspeakers and a load dummy switch contact in parallel with said resistor.

10. The system of claim 9, further including a second current-dependent resistance element in series with said remote loudspeakers and a defeat switch contact in parallel with said second current-dependent resistance element.

11. The system of claim 10, wherein at least one of said first and second current-dependent resistance elements is an incandescent lamp.

12. The system of claim 10, wherein at least one of said first and second current-dependent resistance elements is a high positive temperature coefficient resistance wire.

13. A circuit system for selectively switching between main and remote loudspeakers, powered by an amplifier comprising:

- a pair of input terminals for applying an input audio signal to selected main and remote loudspeakers;

a first switch contact in series with said main loudspeakers for selectively applying said input audio signal to said main loudspeakers;

a second switch contact in series with said remote loudspeakers for selectively applying said input audio signal to said remote loudspeakers; and a resistance element between said amplifier and said remote loudspeakers in series only with said remote loudspeakers for protecting only said remote loudspeakers from overdrive.

* * * * *